United States Patent [19]

Ueno et al.

[11] Patent Number: 5,017,808
[45] Date of Patent: May 21, 1991

[54] BI-MOS LOGIC CIRCUIT HAVING A SWITCH CIRCUIT FOR DISCHARGING ELECTRICAL CHARGE ACCUMULATED IN A PARASITIC CAPACITOR

[75] Inventors: Masaji Ueno, Chofu; Kumi Ofusa, Yokohama, both of Japan

[73] Assignee: Kabushiki Kaisha Toshiba, Kanagawa, Japan

[21] Appl. No.: 472,272

[22] Filed: Jan. 30, 1990

[30] Foreign Application Priority Data

Feb. 2, 1989 [JP] Japan ................................. 1-24543

[51] Int. Cl.$^5$ ............................................. H03K 19/01
[52] U.S. Cl. ...................................... 307/446; 307/481; 307/570; 307/272.2
[58] Field of Search ................ 307/443,446, 451–452, 307/481, 570, 272.2

[56] References Cited

U.S. PATENT DOCUMENTS

| | | | |
|---|---|---|---|
| 4,719,373 | 1/1988 | Masuda et al. ..................... | 307/570 |
| 4,804,869 | 2/1989 | Masuda et al. ..................... | 307/446 |
| 4,841,172 | 6/1989 | Ueno et al. ........................ | 307/446 X |
| 4,849,658 | 7/1989 | Iwamura et al. .................. | 307/481 X |
| 4,880,998 | 11/1989 | Ueda ................................. | 307/446 |
| 4,902,914 | 2/1990 | Masuoka ........................... | 307/452 X |
| 4,914,318 | 4/1990 | Allen ................................. | 307/272.2 |

FOREIGN PATENT DOCUMENTS

| | | | |
|---|---|---|---|
| 0025424 | 2/1984 | Japan .................................. | 307/446 |
| 63-45916 | 8/1988 | Japan . | |
| 8905547 | 6/1989 | World Int. Prop. O. .......... | 307/446 |

OTHER PUBLICATIONS

"BiCMOS LSSD Latch in Integrated Complementary Logic", *IBM T.D.B.*, vol. 32, No. 53, Oct. 1989, pp. 285-286.

CMOS Multi-Way and Logic, IBM Technical Disclosure Bulletin, vol. 28, No. 12, p. 5317, New York (May 1986).

*Primary Examiner*—David Hudspeth
*Attorney, Agent, or Firm*—Banner, Birch, McKie & Beckett

[57] ABSTRACT

Disclosed herein is a Bi-MOS logic circuit comprising first and second NPN transistors forming an output buffer; first and second MOS transistors for controlling the NPN transistors when the logic circuit is set to a data-latching mode; and third and fourth MOS transistors for controlling the NPN transistors when the logic circuit is set to a data-inputting mode. The Bi-MOS logic circuit further comprises a switch circuit for discharging a parasitic capacitor located at the node of the series circuit comprised of the first and second MOS transistors.

6 Claims, 2 Drawing Sheets

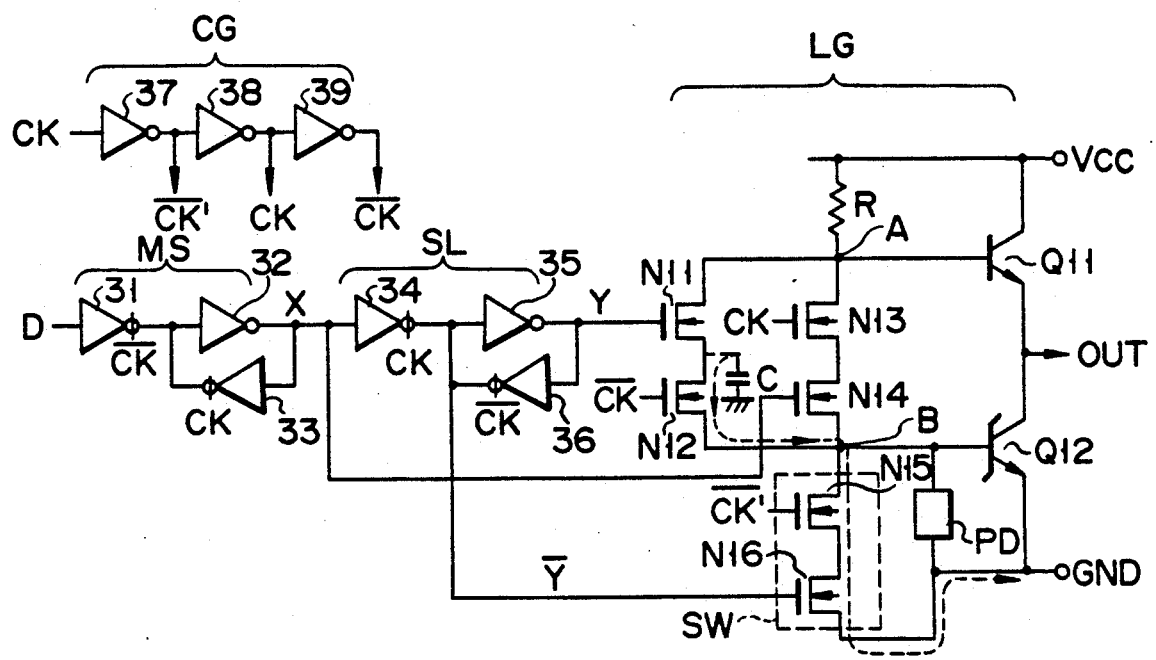
F I G. 2

BI-MOS LOGIC CIRCUIT HAVING A SWITCH CIRCUIT FOR DISCHARGING ELECTRICAL CHARGE ACCUMULATED IN A PARASITIC CAPACITOR

BACKGROUND OF THE INVENTION

1. Field of the Invention

The present invention relates to a Bi-MOS logic circuit incorporated in a Bi-MOS semiconductor IC which comprises bipolar transistors and MOS transistors—all formed on a single semiconductor chip—, and more particularly to a Bi-MOS logic circuit which is suitable as a D-type latch circuit or a D-type master-slave flip-flop circuit. 2. Description of the Related Art The output buffer circuit used in most Bi-MOS logic circuits comprises NPN transistors. The NPN transistors are switched on or off by a drive circuit which has MOS transistors. The drive circuit, which comprises MOS transistors, consumes very little power, particularly when it has a CMOS structure. The output buffer circuit, which comprises NPN transistors, has a great current-driving ability. Hence, a Bi-MOS logic circuit is advantageous in two respects. First, it can operate at high speed. Second, it consumes but a little power.

FIG. 1 illustrates a conventional Bi-MOS logic circuit, which functions as a D-type latch circuit As is shown in FIG. 1, the logic circuit has an output buffer circuit which comprises an NPN transistor Q1 and a Schottky-barrier NPN transistor Q2. These transistors Q1 and Q2 are switched on or off by a drive circuit comprising four N-channel MOS transistors N1 to N4.

The Bi-MOS logic circuit can operate in two modes, a data-inputting mode and a data-latching mode. The logic circuit is set to the data-inputting mode when the clock signals CK and $\overline{CK}$ supplied to it are at logic "1" level (hereinafter called "1" level') and logic "0" level (hereinafter called "0" level'), respectively. It is set to the data-latching mode when the clock signals CK and $\overline{CK}$ are at "0" level and "1" level, respectively.

While the logic circuit is set to the data-inputting mode, the transistor N3 is turning on by the clock signal CK at "1" level, and the transistor N2 is turning off by the clock signal $\overline{CK}$ at "0" level. The current path between nodes A and B is either enabled or disabled, in accordance with whether the transistor N4 is turned on or off under the control of the data D input to the logic circuit.

More precisely, when the input data D is at "1" level, the transistor N4 is turned on, thus enabling the current path between the nodes A and B. In this case, a current flows from a power-supply terminal Vcc to the base of the transistor Q2 through a resistor R, the transistor N3, and the transistor N4. The transistor Q2 is thereby turned on. As a result of this, the output signal OUT of the logic circuit is at "0" level. At this time, the potentials of both nodes A and B are set at "0" level, i.e., approximately the base-emitter voltage (e.g., 1 V) of the transistor Q2 which is on. On the other hand, when the input data D is at "0" level, the transistor N4 is turned off, disabling the current path between the nodes A and B. In this case, a current flows from a power-supply terminal Vcc to the base of the transistor Q1 through the resistor R. The transistor Q1 is thereby turned on. As a result of this, the output signal OUT of the logic circuit is at "1" level. At this time, the potential of the node A is set at "1" level.

While the logic circuit is set to the data-latching mode, the clock signal CK at "0" level turns the transistor N3 off, and the clock signal $\overline{CK}$ at "1" level turns the transistor N2 on. The current path between nodes A and B is either enabled or disabled, in accordance with whether the transistor N1 is turned on or off under the control of the output of an inverter I1 which has inverted the potential of the node A.

As has been described, the potential at the node A is at the "1" level when the output signal OUT remains at the "1" level, that is, when the transistor Q1 is on, while the logic circuit is in the data-inputting mode. When the operating mode is changed in this condition, from the data-inputting mode to the data-latching mode, the transistor N1 remains off-state by virtue of the output of the inverter I1 which is at the "0" level. Hence, the current path between the nodes A and B is disable and the potential of node A is maintained at the "1" level. The output signal OUT of the logic circuit is thereby maintained at the "1" level, too. On the other hand, when the output signal OUT remains at the "0" level, that is, when the transistor Q2 is on, while the logic circuit is in the data-inputting mode, the potential at the node A is at the "0" level. When the operating mode is changed in this condition, from the data-inputting mode to the data-latching mode, the transistor N1 remains on-state by virtue of the output of the inverter I1 which is at the "1" level. Hence, the current path between the nodes A and B is enabled, and the potential of the node A is maintained at the "0" level. The output signal OUT of the logic circuit is thereby maintained at the "0" level, too.

As has been described, the Bi-MOS logic circuit shown in FIG. 1 outputs a signal OUT at the logic level opposite to that of the input data D while the circuit is in the data-inputting mode. Once it is set to the data-latching mode, its output signal OUT is maintained at the level same as that of the signal OUT when the circuit is in the data-inputting mode. When the logic circuit is set to the data-inputting mode again, it outputs a signal OUT which is at the level opposite to that of the input data D.

When its operation mode is changed from the data-latching mode, wherein the output signal OUT remains at the "0" level, to the data-latching mode wherein the output signal OUT remains at the "1" level (more precisely, when the circuit is set to the data-latching mode, thus maintaining its output signal OUT at the "0", it is set to the data-inputting mode and outputs a signal OUT at the "1" level, and further it it set to the data-latching mode again, thus maintaining the output signal OUT at the "1" level), the Bi-MOS logic circuit has the following problem.

In the data-latching mode, wherein the output signal OUT remains at the "0" level, the transistors N1 and N2 are on. When the operation mode of the logic circuit is changed to the data-inputting mode, the transistor N2 is turned off by the inverted clock signal $\overline{CK}$ at the "0" level. On the other hand, the transistor N1 remains on until the inverter I1 outputs a signal at the "0" level, that is, until the potential of the node A increases to the "1" level, thus turning the transistor Q1 on. While the transistor N1 is on, the parasitic capacitor C located at the node of the transistors N1 and N2 is continuously charged because of the current supplied from the power-supply terminal Vcc through the resistor R. When the operation mode of the logic circuit is switched from the data-inputting mode to the data-latching mode, the electrical charge accumulated in the parasitic capacitor C is released through the transistor N2, which has been turned on, and is supplied to the base of the transistor Q2. Obviously, not only the transistor Q1, but also the transistor Q2 remains on after the operation mode is changed to the data-latching mode and before the parasitic capacitor C is completely discharged. A current flows through these transistors Q1 and Q2, both being on, from the power-supply terminal Vcc to a ground terminal GND. Consequently, the logic circuit consumes much power, and the "1"-level potential of the output signal OUT decreases about 0.5 V.

As has been described, the conventional Bi-MOS logic circuit is disadvantageous in view of the large power consumption and the decrease in the "1"-level potential of the signal OUT, either resulting from the charge accumulated in the parasitic capacitor located at the node of the serial circuit constituted by the transistors N1 and N2.

SUMMARY OF THE INVENTION

It is an object of the present invention to provide a Bi-MOS logic circuit which consumes but a little power and outputs a signal at a sufficiently high level, in spite of the charge accumulated in a parasitic capacitor, and which therefore has a good operating characteristic.

According to the invention, there is provided a Bi-MOS logic circuit which comprises: a first NPN transistor connected between a power-supply potential terminal and a signal-outputting terminal; a second NPN transistor connected between the signal-outputting terminal and a reference potential terminal; a load circuit connected between the power-supply potential terminal and the base of the first NPN transistor; a first series circuit connected between the base of the first NPN transistor and the base of the second NPN transistor, and including first and second MOS transistors, the first MOS transistor being controlled by a first input data signal, and the second MOS transistor being controlled a first clock signal; a second series circuit connected between the base of the first NPN transistor and the base of the second NPN transistor, and including third and fourth MOS transistors, said third MOS transistor being controlled by a second clock signal opposite in phase to the first clock signal, and the fourth MOS transistor being controlled by a second input data signal advanced in phase with respect to the first input data signal; and switching means connected between the base of the second NPN transistor and the reference potential terminal, said switching means being on when the first and second MOS transistors are off and on, respectively.

In this Bi-MOS logic circuit, the switching means is turned on when the first and second MOS transistors are off and on, respectively. Therefore, the charge accumulated in the parasitic capacitor located at the node of these MOS transistors is not applied to the base of the second NPN transistor. Rather, it is discharged through the switching means. There is no possibility that the charge accumulated in the parasitic capacitor adversely turn on the second NPN transistor. Hence, the Bi-MOS logic circuit according to the invention consumes but a little power, and has a good operating characteristic.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a diagram illustrating a Bi-MOS logic circuit according to a first embodiment of the present invention;

DETAILED DESCRIPTION OF THE PREFERRED EMBODIMENTS

Figure 1:
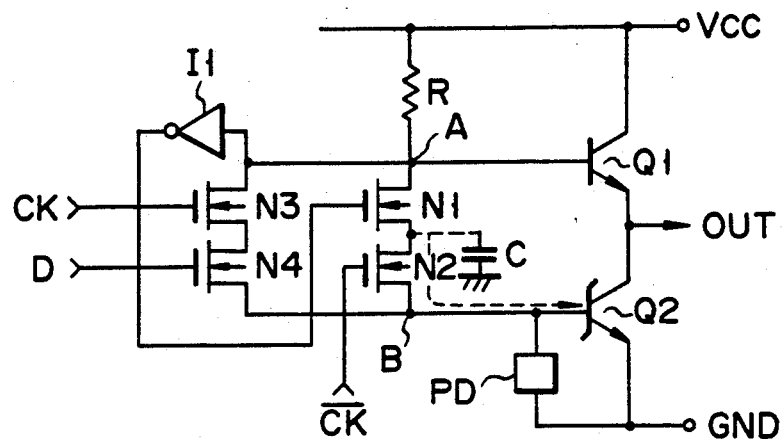
FIG. 1 is a diagram showing a conventional Bi-MOS logic circuit.

A first embodiment of the invention, i.e., a Bi-MOS logic circuit, will now be described with reference to FIG. 2. This Bi-MOS logic circuit is a D-type master-slave flip-flop circuit.

The D-type master-slave flip-flop circuit comprises a master circuit MS, a slave circuit SL, an output logic circuit LG, and a clock generator CG—all formed on a single semiconductor chip. The master circuit MS has CMOS clocked inverters 31 and 33, and a CMOS inverter 32. The CMOS clocked inverter 31 is controlled by an inverted clock signal K/ . The input of the inverter 31 receives an input data signal D, and the output thereof is connected to the input of the CMOS inverter 32. The output signal of the CMOS inverter 32 is supplied, as a master output X, to the slave circuit SL, and also to the input of the CMOS clocked inverter 33. The inverter 33 is controlled by a cock signal $\overline{CK}$. The output signal of the inverter 33 is supplied to the input of the CMOS inverter 32.

The slave circuit SL comprises CMOS clocked inverters 34 and 36, and a CMOS inverter 35. The CMOS clocked inverter 34 is controlled by the clock signal CK. The input of the inverter 34 receives the master output X from the master circuit MS, and the output thereof is coupled to the input of the CMOS inverter 35. The output signal of the CMOS inverter 35 is supplied, as a slave output Y, to the output logic circuit LG, and also to the input of the CMOS clocked inverter 36. The inverter 36 is controlled by the inverted clock signal $\overline{CK}$. The output signal of the inverter 36 is supplied to the input of the CMOS inverter 35.

The output logic circuit LG comprises an NPN transistor Q11, a Schottky-barrier NPN transistor Q12, four N-channel MOS transistors N11 to N14, a switch circuit SW, a resistor R, and a pull-down circuit PD. The NPN transistor Q11 and Q12 are connected in series, forming a series circuit connected between a power-supply terminal Vcc and a ground terminal GND. The potential at the node of these transistors Q11 and Q12 is the output signal OUT of the Bi-MOS logic circuit. The resistor R is connected between the power-supply terminal Vcc and the base of the NPN transistor Q11. The N-channel MOS transistors N11 and N12 are connected in series, forming a series circuit coupled between the bases of the NPN transistors Q11 and Q12. The slave output Y is supplied to the gate of the N-channel MOS transistor N11 from the slave circuit SL. The inverted clock signal $\overline{CK}$ is supplied to the gate of the N-channel MOS transistor N12. The N-channel MOS transistors N13 and N14 are coupled in series, thus forming a series circuit connected between the bases of the NPN transistors Q11 and Q12. The clock signal CK is supplied to the gate of the N-channel MOS transistor N13. The master output X is supplied to the gate of the N-channel MOS transistor N14 from the master circuit MS. The master output X is a signal advanced in phase with respect to the slave output Y by the half cycle of the clock signal CK.

The switch circuit SW comprises N-channel MOS transistors N15 and N16. These transistors N15 and N16 are connected in series, forming a series circuit coupled between the base of the NPN transistor Q12 and the ground terminal GND. The clock signal CK' is supplied to the gate of the N-channel MOS transistor N15. This clock signal CK' is advanced in phase with respect to the inverted clock signal $\overline{CK}$. The output signal of the CMOS clocked inverter 34 incorporated in the slave circuit SL is supplied to the gate of the N-channel MOS transistor N16.

The pull-down circuit PD is connected between the ground terminal GND and the gate of the NPN transistor Q12. The pull-down circuit PD is designed to pull the base charge of the NPN transistor Q12; it is a resistor, for example.

The clock generator CG, which is designed to generate three clock signals CK', CK, and $\overline{CK}$, comprises three CMOS inverters 37, 38, and 39 which are cascade-connected. The output of the first CMOS inverter 37 is used as clock signal CK'; that of the second CMOS inverter 38 is used as clock signal CK; and that of the third CMOS inverter 39 is used as clock signal $\overline{CK}$. The clock signal CK', i.e., the output signal of the first CMOS inverter 37, is advanced in phase by two inverters 38, 39 with respect to the clock signal $\overline{CK}$.

The operation of the D-type master-slave flip-flop circuit shown in FIG. 2 will now be explained.

The master circuit MS is set to the data-inputting mode when the clock signals CK and $\overline{CK}$ are at the "0" level and the "1" level, respectively. It is set to the data-latching mode when the clock signals CK and $\overline{CK}$ are at the "1" level and the "0" level, respectively. On the other hand, the slave circuit SL is set to he data-latching mode when the clock signals CK and $\overline{CK}$ are at the "0" level and the "1" level, respectively, and is set to the data-inputting mode when these clock signals CK and $\overline{CK}$ are at the "1" level and the "0" level, respectively. In other words, the save circuit SL is set to the data-latching mode when the master circuit MS is set to the data-inputting mode, and is set to the data-inputting mode when the master circuit MS is set to the data-latching mode.

Like the slave circuit SL, the output logic circuit LG is set to the data-inputting mode when the clock signals CK and $\overline{CK}$ are at the "1" level and the "0" level, respectively, and is set to the data-latching mode when the signals CK and $\overline{CK}$ are at the "0" level and the "1" level, respectively.

When the output logic circuit LG is set to the data-inputting mode, the clock signal CK at the "1" level turns the transistor N13 on, and the inverted clock signal $\overline{CK}$ at the "0" level turns the transistor N12 off. The current path between the nodes A and B is enabled or disabled in accordance with whether or not the master output X supplied from the master circuit MS has turned the transistor N14 on or off. More specifically, as long as the master circuit MS maintains its output X at the "1" level, the transistor N14 is on, enabling the current path between the nodes A and B. In this case, a current flows from the power-supply terminal Vcc to the base of the transistor Q12 through the resistor R and the transistors N13, N14 whereby the transistor Q12 is turned on. As a result the output signal OUT is set at the "0" level. In contrast, as long as the master circuit MS maintains its output X at the "0" level, the transistor N14 is off, disabling the current path between the nodes A and B. In this instance, a current flows from the power-supply terminal Vcc to the base of the transistor Q11 through the resistor R, whereby the transistor Q11 is turned on. Hence the output signal OUT is set at the "1" level.

When the output logic circuit LG is set to the data-latching mode, the clock signal CK at the "0" level turns the transistor N13 off, and the inverted clock signal $\overline{CK}$ at the "1" level turns the transistor N12 on. The current path between the nodes A and B is enabled or disabled in accordance with whether or not the slave output Y supplied from the slave circuit SL has turned the transistor N11 on or off. More specifically, as long as the slave circuit SL maintains its output Y at the "0" level, the transistor N11 is off, disabling the current path between the nodes A and B. In this case, a current flows from the power-supply terminal Vcc to the base of the transistor Q11 via the resistor R, whereby the transistor Q11 is turned on. As a result the out put signal OUT is set at the "1" level. In contrast, as long as the slave circuit SL maintains its output Y at the "1" level, the transistor N11 is on, enabling the current path between the nodes A and B. In this case, a current flows from the power-supply terminal Vcc to the base of the transistor Q12 through the resistor R and the transistors N11 and N12, whereby the transistor Q12 is turned on. Hence, the output signal OUT is set at the "0" level.

Figure 3:
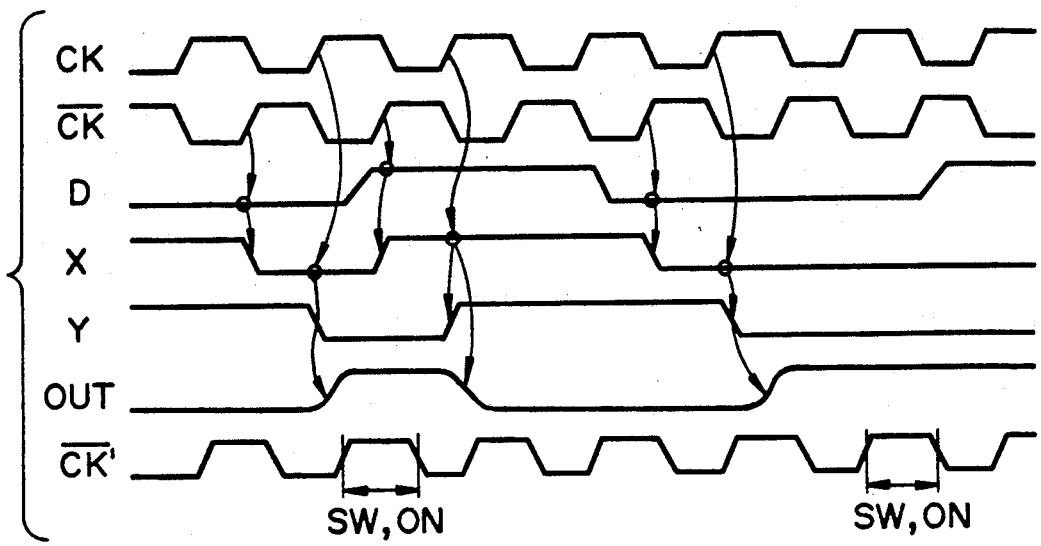
FIG. 3 is a timing chart explaining the operation of the Bi-MOS logic circuit shown in FIG. 2.

With reference to the timing chart of FIG. 3, it will be explained how the output logic circuit LG produces an output signal OUT at the "1" level in accordance with the master output X at the "0" level after its operating mode has been changed from the data-latching mode for holding an output signal OUT at the "0" level, to the data-inputting mode, and how the circuit LG maintain its output signal OUT at the "1" level after its operating mode has been changed again from the data-inputting mode to the data-latching mode.

When the output logic circuit LG is set to the data-latching mode, thus holding the output signal OUT at the "0" level, the transistor N11 is turned on by the "1"-level output Y of the slave circuit SL, and the transistor N12 is turned on, too, by the inverted clock signal $\overline{CK}$ at the "1" level. When the inverted clock signal $\overline{CK}$ falls to the "0" level, the output logic circuit LG is set to the data inputting mode. Hence, the transistor N12 is turned off by the "0"-level inverted clock signal $\overline{CK}$, and the transistor N11 is also turned off when the output Y of the slave circuit SL falls to the "0" level. The transistor N14 is turned off by the "0"-level output X of the master circuit MS. Therefore, the current path between the nodes A and B is disabled. As a result of this, the transistor Q11 is turned on, and the output signal OUT rises from the "0" level to the "1" level.

As has been described, the output signal OUT changes its level from the "0" level to the "1" level when the operating mode of the output logic circuit LG is altered from the data-latching mode to the data-inputting mode. Up until shortly before the output signal OUT is set to the "1" level, however, the slave output Y remains at the "1" level, and the transistor N11 is still on. While the transistor N11 remains on, a current keeps flowing from the power-supply terminal Vcc through the resistor R into the parasitic capacitor C at the node of the transistors N11 and N12, whereby electrical charged is accumulated in the parasitic capacitor C.

Thereafter, the inverted clock signal $\overline{CK}$ rises again to the "1" level, whereby the operating mode of the output logic circuit LG changes from the data-inputting mode to the data-latching mode. Then, the electrical charge is discharged from the parasitic capacitor C via the transistor N12 which is on. Immediately before the inverted clock signal $\overline{CK}$ rises to the "1" level, the output $\overline{Y}$ of the inverter 36 of the slave circuit SL is already at the "1" level, and the clock signal CK' is also at the "1" level. The switch circuit SW is thereby turned on immediately before the parasitic capacitor C is discharged. The electrical charge is applied from the parasitic capacitor C to the ground terminal GND through the switch circuit SW. Therefore, the flow of the electrical charge to the base of the NPN transistor Q12 is suppressed, and both the NPN transistors Q11 and Q12 are prevented from being turned on during the discharge of the parasitic capacitor C. As a result of this, no through currents flow from the power-supply terminal Vcc to the ground terminal GND through the NPN transistor Q11 and the NPN transistor Q12. Thus, the power consumption is small, and a decrease in the level of the output signal OUT is avoided.

When the inverted clock signal $\overline{CK}$ changes its level from the "1" level to the "0" level, the operating mode of the output logic circuit LG is altered from the data-latching mode to the data-inputting mode. Before the level of the clock signal $\overline{CK}$ falls to the "0" level, the clock signal CK' has already changed to the "0" level. The switch circuit SW is therefore turned off prior to the change of the operating mode of the output logic circuit LG. Therefore, the switch circuit SW imposes no adverse influence on the output logic circuit LG while the circuit LG is set to the data-inputting mode.

Figure 4:
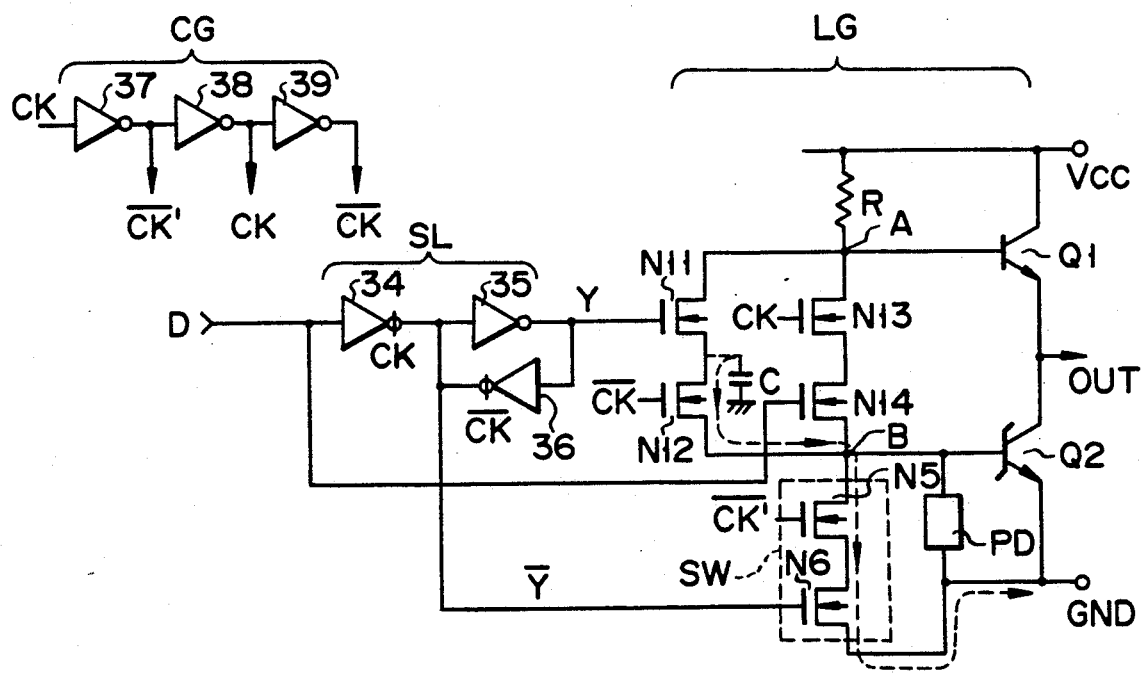
FIG. 4 is a diagram showing a Bi-MOS logic circuit according to a second embodiment of the invention.

FIG. 4 illustrates a Bi-MOS logic circuit according to a second embodiment of the invention. This Bi-MOS logic circuit is a D-type latch circuit which differs from the D-type master-slave flip-flop circuit shown in FIG. 2, in the following respect.

As is shown in FIG. 4, the D-type latch circuit has no components equivalent to the master circuit MS incorporated in the D-type master-slave flip-flop circuit shown in FIG. 2, and the input data D is directly supplied to the slave circuit SL and also to the transistor N14. Also in the D-type latch circuit, the electrical charge is discharged from the parasitic capacitor C to the ground terminal GND through the switch circuit SW. Hence, the power consumption is small, and the logic level of the output signal OUT is not reduced.

Additional advantages and modifications will readily occur to those skilled in the art. Therefore, the invention in its broader aspects is not limited to the specific details, and representative devices, shown and described. Accordingly, departures may be made from such details without departing from the spirit or scope of the general inventive concept as defined by the appended claims and their equivalents.

What is claimed is:

1. A Bi-MOS logic circuit comprising:
   a first NPN transistor connected between a power-supply potential terminal and a signal-outputting terminal;
   a second NPN transistor connected between the signal-outputting terminal and a reference potential terminal;
   a load circuit connected between the power-supply potential terminal and the base of the first NPN transistor;
   a first series circuit connected between the base of the first NPN transistor and the base of the second NPN transistor, and including first and second MOS transistors, the first MOS transistor being controlled by a first input data signal, and the second MOS transistor being controlled a first clock signal;
   a second series circuit connected between the base of the first NPN transistor and the base of the second NPN transistor, and including third and fourth MOS transistors, said third MOS transistor being controlled by a second clock signal opposite in phase to the first clock signal, and the fourth MOS transistor being controlled by a second input data signal advanced in phase with respect to the first input data signal; and
   switching means connected between the base of the second NPN transistor and the reference potential terminal, said switching means being on when the first and second MOS transistors are off and on, respectively.

2. The Bi-MOS logic circuit according to claim 1, wherein said switching means is turned on before said second 0MOS transistor.

3. The Bi-MOS logic circuit according to claim 1, wherein said switching means is turned on and off before said second MOS transistor.

4. The Bi-MOS logic circuit according to claim 1, wherein said switching means includes a fifth MOS transistor and a sixth MOS transistor which are connected in series between the base of said second NPN transistor and said reference potential terminal.

5. The Bi-MOS logic circuit according to claim 4, wherein said fifth MOS transistor is controlled by a third clock signal which is advanced in phase with respect to the first clock signal, and said fifth MOS transistor is controlled by a third input data signal which is opposite in phase to the first input data signal.

6. The Bi-MOS logic circuit according to claim 1, further comprising latch means for receiving the second input data signal when the first clock signal is at logic "0" level, latching and outputting the second input signal as first data signal while the first clock signal is at logic "1" level.

* * * * *